US008093576B1

United States Patent
Lee

(10) Patent No.: US 8,093,576 B1
(45) Date of Patent: Jan. 10, 2012

(54) CHEMICAL-MECHANICAL POLISH TERMINATION LAYER TO BUILD ELECTRICAL DEVICE ISOLATION

(75) Inventor: Jong Won Lee, San Francisco, CA (US)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 12/627,128

(22) Filed: Nov. 30, 2009

(51) Int. Cl.
*H01L 47/00* (2006.01)

(52) U.S. Cl. ............ 257/4; 257/5; 257/42; 257/E45.002; 438/102; 438/95; 438/626

(58) Field of Classification Search .................. 257/4, 5, 257/42, E45.002; 438/102, 95, 626
See application file for complete search history.

(56) References Cited

U.S. PATENT DOCUMENTS

| 4,809,044 A * | 2/1989 | Pryor et al. ........................ 257/3 |
| 2007/0297213 A1* | 12/2007 | Czubatyj et al. ............... 365/148 |
| 2010/0163818 A1* | 7/2010 | Lee et al. ........................... 257/2 |

OTHER PUBLICATIONS

Patent Application filed Nov. 30, 2009 in co-pending U.S. Appl. No. 12/627,080, 46 pages.

* cited by examiner

*Primary Examiner* — Tu-Tu Ho
(74) *Attorney, Agent, or Firm* — Berkeley Law & Technology Group, LLP

(57) ABSTRACT

A method of forming a semiconductor device may comprise forming a memory portion, forming a carbon film, depositing insulation to at least partially cover the carbon film, and terminating patterned removal of the insulation at the carbon film during a fabrication process.

19 Claims, 13 Drawing Sheets

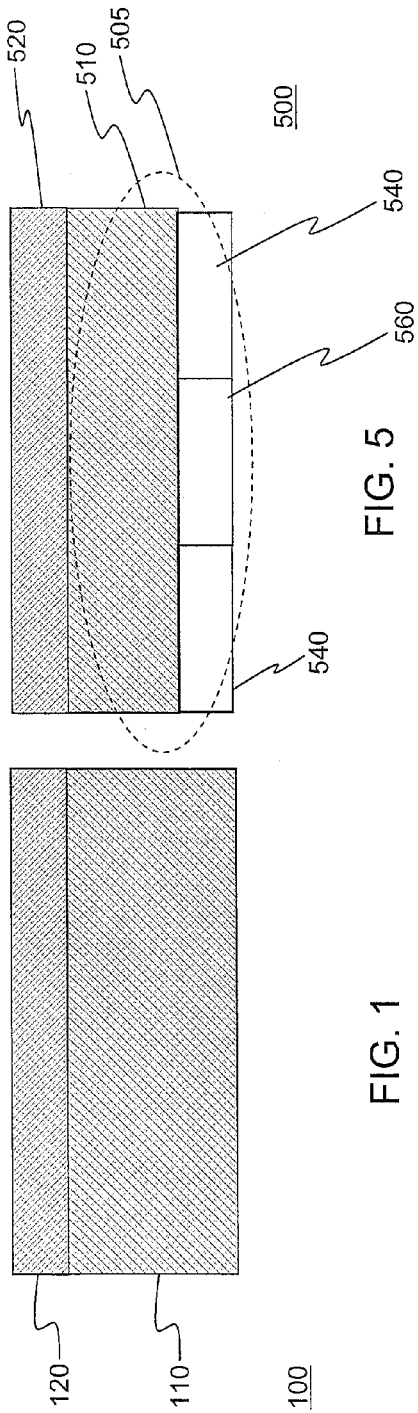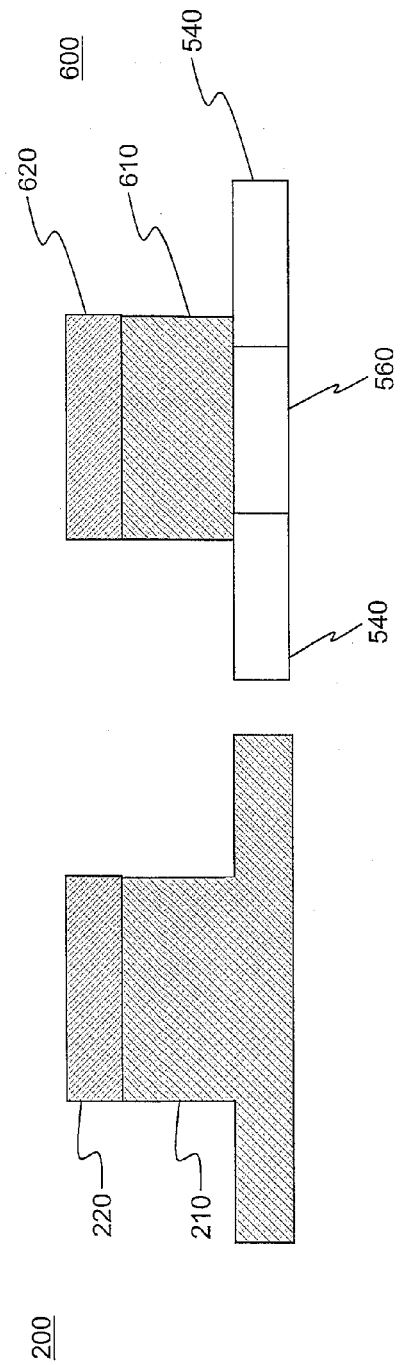

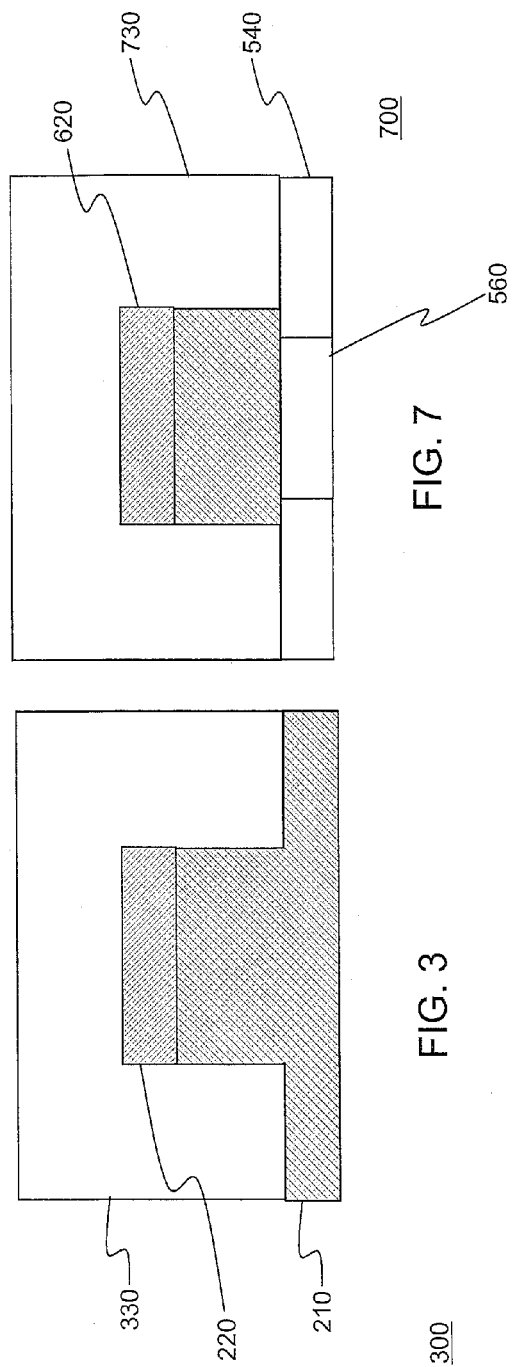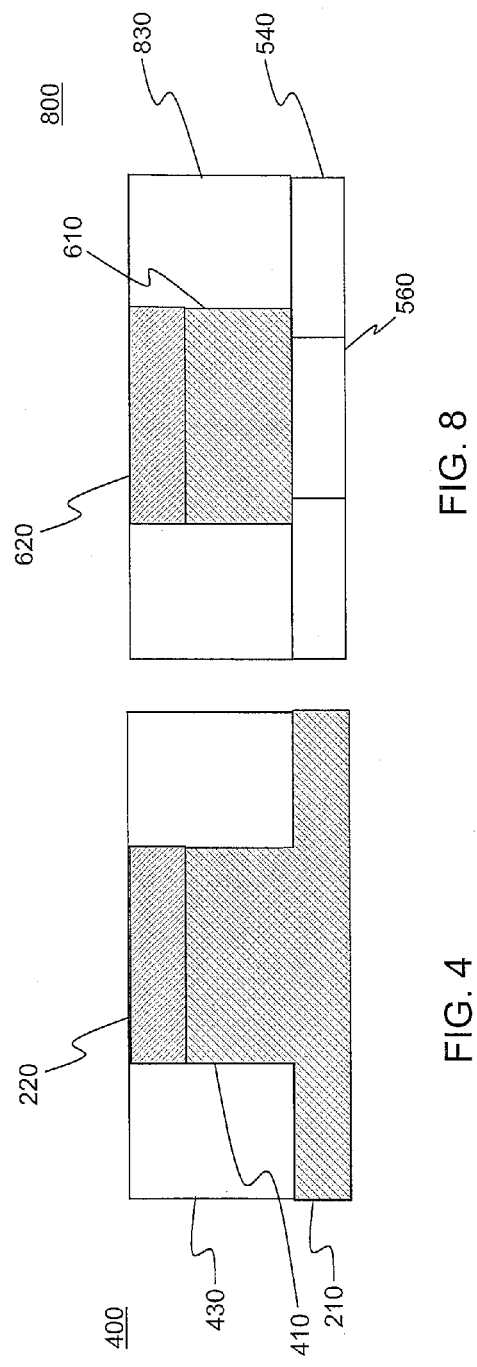

CHEMICAL-MECHANICAL POLISH TERMINATION LAYER TO BUILD ELECTRICAL DEVICE ISOLATION

BACKGROUND

1. Field

Subject matter disclosed herein relates to a semiconductor device and methods of fabricating same.

2. Information

Fabrication of semiconductor devices generally involves deposition of various materials, masking, etching, planarization, and/or polishing, just to name a few processes. In particular, a chemical-mechanical polish (CMP) process may be applied to a semiconductor structure to remove excess material. For example, an insulation material may be used to fill trenches to electrically isolate adjacent memory cell structures. In performing such trench filling, insulation material may overfill trenches and subsequently cover the immediate and surrounding structure. A CMP process may be used to remove such excess insulation material and to expose various layers of an underlying semiconductor structure. Particular attention, however, may be directed to applying a CMP process so that desired material layers, or portions thereof, are removed without inadvertently removing other material. For example, a CMP process may be manually terminated by an operator that observes that an intended amount of material is removed. In another example, particular material layers may be placed above layers to be retained in a semiconductor structure to act as stop layers by providing a physical buffer that slows a CMP process so that an operator may have some time to manually terminate the CMP process before an undesirable amount of material is removed. Such techniques for terminating a CMP process, however, may result in relatively large variability in structural dimensions of fabricated semiconductor devices, which may lead to variability in semiconductor device behavior, and, in some cases, device failure.

BRIEF DESCRIPTION OF THE FIGURES

Non-limiting and non-exhaustive embodiments will be described with reference to the following figures, wherein like reference numerals refer to like parts throughout the various figures unless otherwise specified.

FIGS. 1-4 are cross-section views showing a carbon stop layer during a fabrication process, according to an embodiment.

FIGS. 5-8 are cross-section views showing a carbon stop layer during a fabrication process, according to another embodiment.

DETAILED DESCRIPTION

Figure 10:
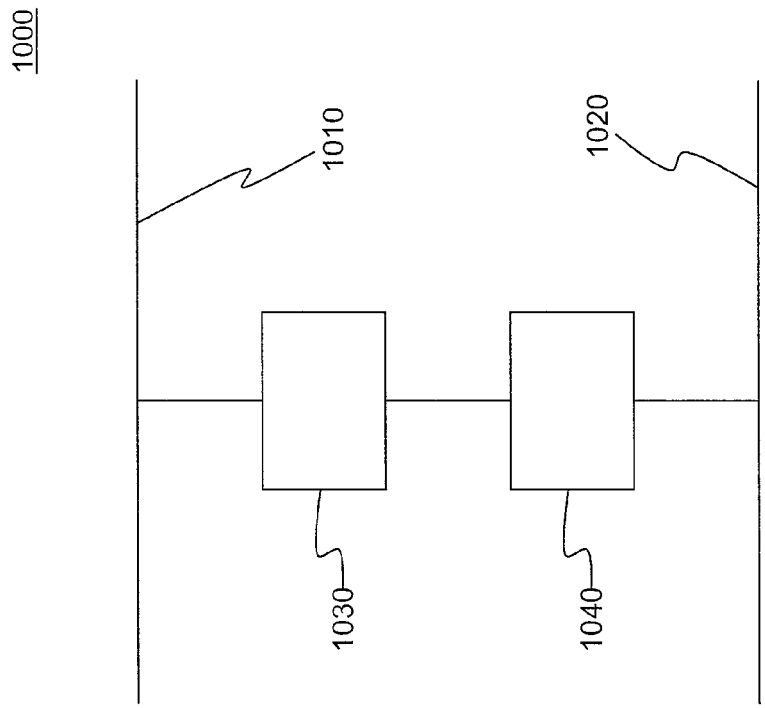
FIG. 10 is a schematic view showing a PCMS cell, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a method of fabricating a semiconductor device involves a technique to terminate removal of dielectric material using a chemical-mechanical polish (CMP) process. Such a technique may be applied, for example, during formation of a device isolation structure, though claimed subject matter is not so limited. In a particular implementation, a deposited thin film of carbon may be incorporated as a top layer of material to be patterned into an active device by a subsequent etching process. Such a layer of carbon may be used to stop a CMP removal process of subsequently deposited insulating dielectric material, such as silicon dioxide and/or a combination of insulating materials. Because carbon may be very selective to a silicon dioxide removal process, such a removal process may auto-terminate once the removal process reaches the carbon film. Additionally, because carbon may have a relatively high resistance to mechanical erosion, a relatively small amount of carbon may be sufficient to provide an effective CMP process termination. After completion of a CMP removal process, such a carbon CMP stop layer may be selectively removed if carbon is not to be a part of a final device structure, for example. Using such a carbon CMP stop layer may provide benefits including improved dimensional consistency among fabricated semiconductor devices, which may lead to improved semiconductor device behavior, for example.

In a particular embodiment, a carbon CMP stop layer may comprise graphitic carbon, which demonstrates a strong chemical reactivity contrast between carbon and silicon oxide. Accordingly, a CMP slurry may be designed to have high selectivity to silicon oxide (e.g., better than 50-to-1). Conversely, because of the strong chemical reactivity contrast between carbon and silicon oxide, an etch process may include removing carbon without removing surrounding insulating material.

In a particular embodiment, a carbon CMP stop layer may be used in a process to fabricate a semiconductor device by a subtractive process (e.g., removing undesired material), wherein a buried device is re-exposed to make electrical contact from a top portion. Phase change memory and magnetic memory devices are two examples of such devices. In a particular implementation, a method of forming such a semiconductor device may include depositing a carbon film on an active thin film and/or substrate, patterning and etching the carbon film and active thin film and/or substrate to form a damascene stack adjacent to a trench, depositing insulation to fill the trench and to cover the carbon film, and removing at least a portion of the insulation using a CMP process that auto-terminates at the carbon film.

FIGS. 1-4 are cross-section views showing a carbon stop layer during a fabrication process, according to an embodiment. Such a process may be used to fabricate a variety of microelectronic devices if an isolation/passivation portion of such a process is compatible with carbon. For example, III-V compound semiconductor devices such as diode lasers and/or MESFETs may be fabricated using such a process. On the other hand, a process involving a furnace process, such as an isolation/passivation process used for silicon CMOS, for example, may be incompatible with carbon. For example, in FIG. 1, a structure 100 may comprise a conductive substrate or a conductive thin film 110 that may be fabricated into a device as follows. Conductive substrate or a conductive thin film 110 may be covered by carbon layer 120, which may comprise graphitic carbon deposited by physical vapor deposition (PVD), though claimed subject matter is not so limited. As shown in FIG. 2, both carbon layer 120 and active substrate/thin film 110 are patterned and etched using any one of several patterning technologies (e.g., photolithography) and etching technologies (e.g., plasma etch). Resulting structure 200 may comprise patterned substrate/thin film 210 and patterned carbon layer 220. As shown in FIG. 3, one or more insulating materials 330 may be deposited to surround patterned substrate/thin film 210 and patterned carbon layer 220. Such insulating materials may overfill trenches adjacent to patterned substrate/thin film 210 and patterned carbon layer 220 to bury structure 300. In FIG. 4, insulating material 330 may be removed by a CMP process, stopping on patterned carbon layer 220. Resulting structure 400 may comprise patterned substrate/thin film 210, patterned carbon layer 220 (acting as a stop layer), active device 410, and insulation 430 having a planer top surface at substantially the same level as patterned carbon layer 220. Such a CMP process may involve a CMP slurry, pad, and platten/heads that may be selected to minimize recess/dishing of insulating material around the device active structure. Depending on a particular implementation, patterned carbon layer 220 may be retained and buried (or at least partially exposed) by subsequent fabrication processes, or removed by any one of several etching processes (not shown).

FIGS. 5-8 are cross-section views showing a carbon stop layer during a fabrication process, according to another embodiment. Such a process may be used to fabricate a variety of microelectronic devices that comprise deposited thin films, such as phase change memory devices, magnetic memory devices, and/or resistive memory devices, just to name a few examples. For example, in FIG. 5, a structure 500 may comprise a semiconductor device 505 already formed before deposition of a carbon layer 520. In one implementation, semiconductor device 505 may comprise a conductive interconnect line 560 between insulation lines 540, and conductive stack 510. Carbon layer 520 may comprise graphitic carbon deposited by PVD, though claimed subject matter is not so limited. As shown in FIG. 6, both carbon layer 520 and conductive stack 510 are patterned and etched using any one of several patterning technologies (e.g., photolithography) and etching technologies (e.g., plasma etch). Resulting structure 600 may comprise patterned conductive stack 610 and patterned carbon layer 620. As shown in FIG. 7, one or more insulating materials 730 may be deposited to surround patterned conductive stack 610 and patterned carbon layer 620. Such insulating materials may overfill trenches adjacent to patterned conductive stack 610 and patterned carbon layer 620 to bury structure 700. In FIG. 8, insulating material 730 may be removed by a CMP process, stopping on patterned carbon layer 620. Resulting structure 800 may comprise a conductive interconnect line 560 between insulation lines 540, patterned conductive stack 610, patterned carbon layer 620 (acting as a stop layer), and insulation 830 having a planer top surface at substantially the same level as patterned carbon layer 620. In one implementation, patterned conductive stack 610 may include an active device, which may comprise a patterned conductive and/or semi-conductive structure, for example. A CMP process may involve a CMP slurry, pad, and platten/heads that may be selected to minimize recess/dishing of insulating material around the device active structure. Depending on a particular implementation, patterned carbon layer 620 may be retained and buried (or at least partially exposed) by subsequent fabrication processes, or removed by any one of several etching processes (not shown).

In an embodiment, a technique, described in detail below, using a carbon layer as a stop layer for a CMP process, may be applied to a process of fabricating a semiconductor device comprising a phase change memory-switch (PCMS). In one implementation, a PCMS may comprise a plurality of PCMS cells arranged in an array. In particular, such an array of PCMS cells may be located at intersections of rows and columns of signal lines, thus forming a cross-point array structure. Accordingly, a memory controller, for example, may select a particular PCMS cell for a write, read, and/or erase operation by applying such an operation via a particular pair of row-column lines intersecting at an affected PCMS cell.

Figure 9:
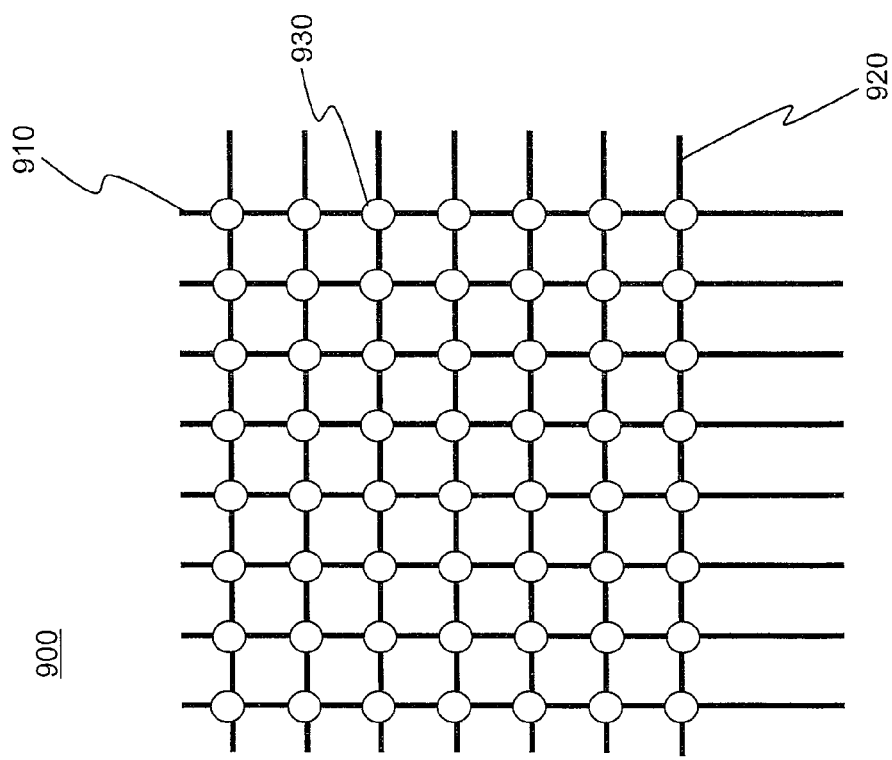
FIG. 9 is a schematic top view showing a cross-point array of phase change memory-switch (PCMS) cells, according to an embodiment.

FIG. 9 is a schematic top view showing a cross-point array 900 of PCMS cells 930 located at intersections of column signal lines 920 and row signal lines 910, according to an embodiment. Individual column and/or row signal lines may be electrically connected to a memory controller to selectively operate PCMS cells 130, for example.

FIG. 10 is a schematic view showing a PCMS cell 1000, according to an embodiment. PCMS cell 1000 may comprise a specific example of PCMS cell 130 shown in FIG. 1, for example, though claimed subject matter is not so limited. PCMS cell 1000 may comprise switch portion 1030 and memory portion 1040 electrically connected in series. In one implementation, switch portion 1030 may be electrically connected and adjacent to column line 1010 while memory portion 1040 may be electrically connected and adjacent to row line 1020. In another implementation, switch portion 1030 may be electrically connected and adjacent to row line 1020 while memory portion 1040 may be electrically connected and adjacent to column line 1010. Such implementations will be described in further detail below. Herein, a PCMS cell may comprise a structure that comprises a switch portion and a memory portion. In a particular implementation, a PCMS cell may comprise a switch portion in series with a memory portion, such as shown in the example of FIG. 10, though claimed subject matter is not so limited. Such a switch portion may be operated by a memory controller to provide a relatively low impedance path to a connected memory portion, for example.

In an embodiment, a process to fabricate a PCMS cell may include applying a carbon layer as a stop layer for a CMP process. Such a process may first use a first mask to mask a row metal layer covered with a memory material layer. In addition, a carbon layer may be deposited on the memory material layer. The carbon layer, the memory material layer and the row metal layer may be subsequently etched using the first etch mask to form first trenches between substantially parallel rows of the etched carbon layer, memory material layer and etched row metal layer. Such an etched memory material layer may result in a memory device or memory portion of a PCMS cell, for example. First trenches may then be filled with a first passivation material that may also cover the memory portion of the PCMS cell. Such a resulting structure may then be subjected to a CMP process that uses a carbon layer as a stop layer, as described above. Accordingly, first passivation material may be removed to result in a planer structure that may subsequently be covered with additional layers that may be etched to form a switch portion of a PCMS cell. Additional layers may be masked with a second etch mask to define substantially parallel columns that are substantially perpendicular to the rows described above. The additional layers may then be etched using the second etch mask to faun second trenches between substantially parallel columns of the etched additional layers. Such etched additional layers may result in a switch device or switch portion of a PCMS cell, for example. Accordingly, such a process, which may involve merely two masking processes, may result in a self-aligned PCMS cell. Such a process that includes using a carbon layer as a stop layer may provide benefits including reduced variability of vertical dimensions of a PCMS cell. Also, a CMP process time need not be precisely controlled in a manual fashion since a carbon stop layer may provide auto-termination of the CMP process, for example. Such a fabrication process may be used to fabricate an array of PCMS cells in a cross-point configuration. In such an array, individual memory cells, including a memory portion and a switch portion electrically connected in series, may be formed between row and column lines. Thus, a process to fabricate such a relatively complex structure having reduced dimensional variability, which may merely involve two masking processes, may lead to reduced fabrication cost and improved yield, for example.

Figure 11:
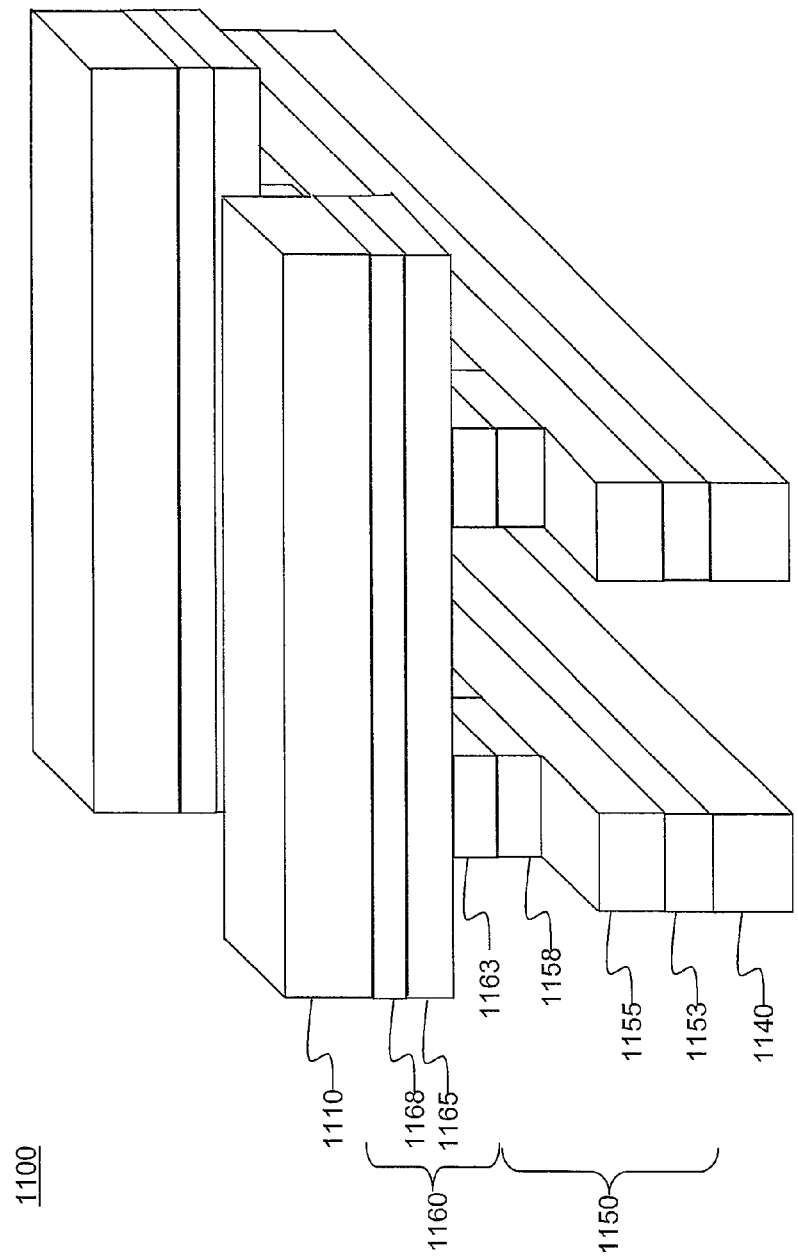
FIG. 11 is a perspective view of multiple PCMS cells arranged in a portion of a cross-point array, according to an embodiment.

FIG. 11 is a perspective view of multiple PCMS cells arranged in a portion 1100 of a cross-point array, according to an embodiment. For example, such PCMS cells may be formed from a fabrication process described above and in further detail below. A PCMS cell may comprise a memory portion 1150 adjacent to row lines 1140 and a switch portion 1160 adjacent to column lines 1110. Row lines 1140 and column lines 1110, extending across a plurality of such PCMS cells, may carry electrical signals to/from a memory controller, memory write circuitry, and/or memory read circuitry (not shown) including sense amplifiers, for example. Row lines 1140 may be substantially perpendicular to column lines 1110 in a cross-point array, wherein a PCMS cell may be located at intersections of row lines 1140 and column lines 1110. Memory portion 1150 may include a memory bottom electrode 1153, a memory phase change material (PCM) 1155, and a top memory electrode 1158. Switch portion 1160 may include a switch bottom electrode 1163, a switch PCM 1165, and a top switch electrode 1168. In one implementation, switch bottom electrode 1163 may comprise a carbon layer that may have been used as a stop layer for a CMP process during fabrication of cross-point array portion 1100. In one implementation, such a carbon layer may be subjected to a thermal annealing process to improve its electrical conductivity. Of course, such details of cross-point array portions 1100 are merely examples, and claimed subject matter is not so limited. For example, in another embodiment, a PCMS cell may comprise a memory portion adjacent to column lines 1110 and a switch portion adjacent to row lines 1110.

Figure 12:
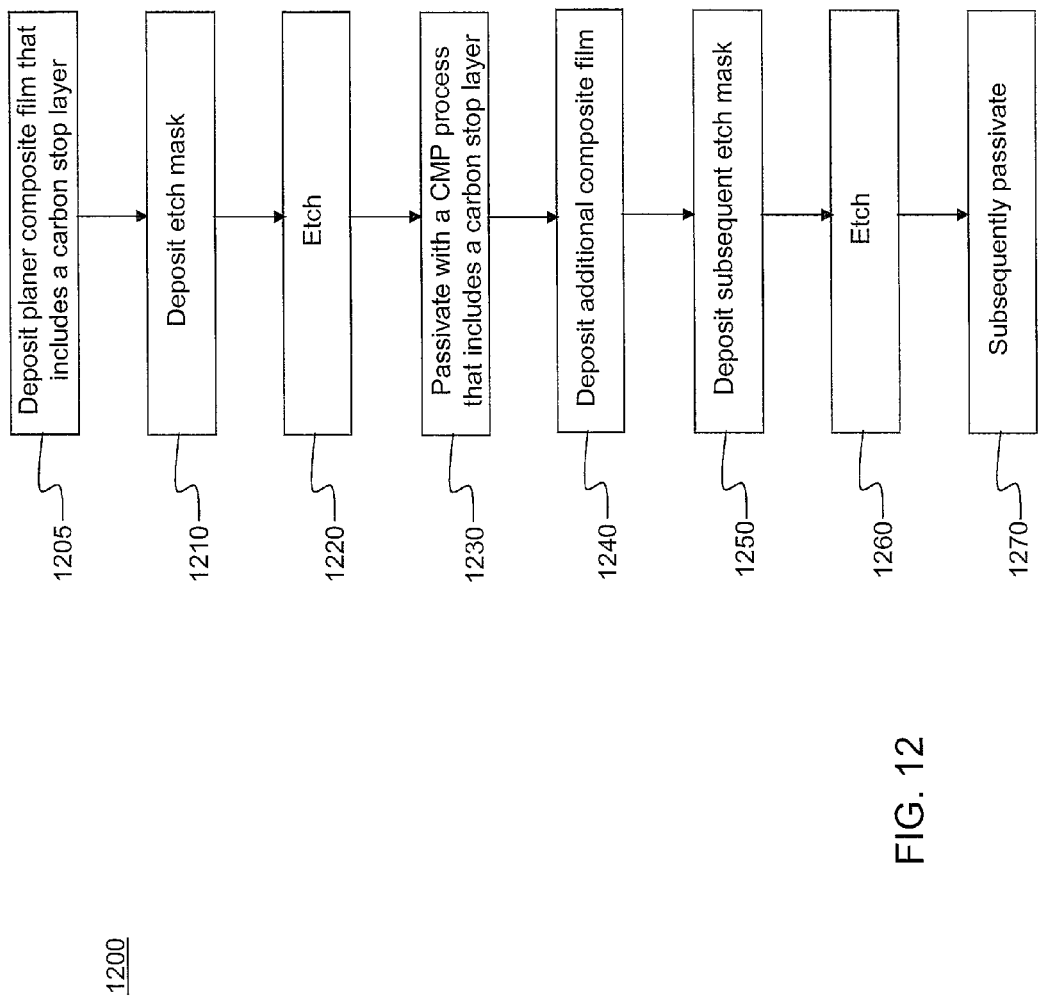
FIG. 12 is a flow diagram of a process for fabricating a PCMS cell, according to an embodiment.
Figure 13:
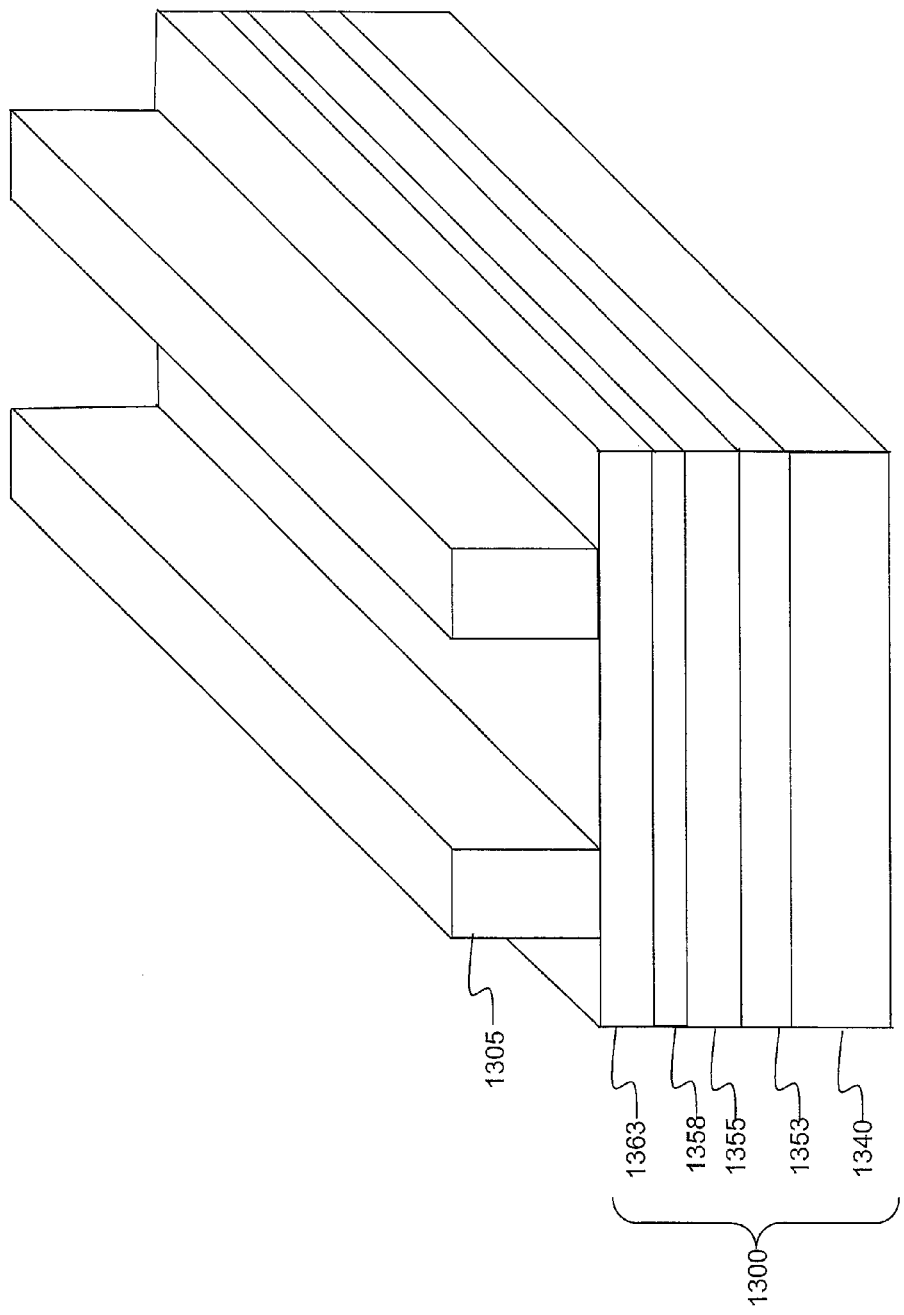
FIGS. 13-19 are perspective views showing structures resulting from various portions of a process to fabricate a PCMS cell, according to an embodiment.
Figure 14:
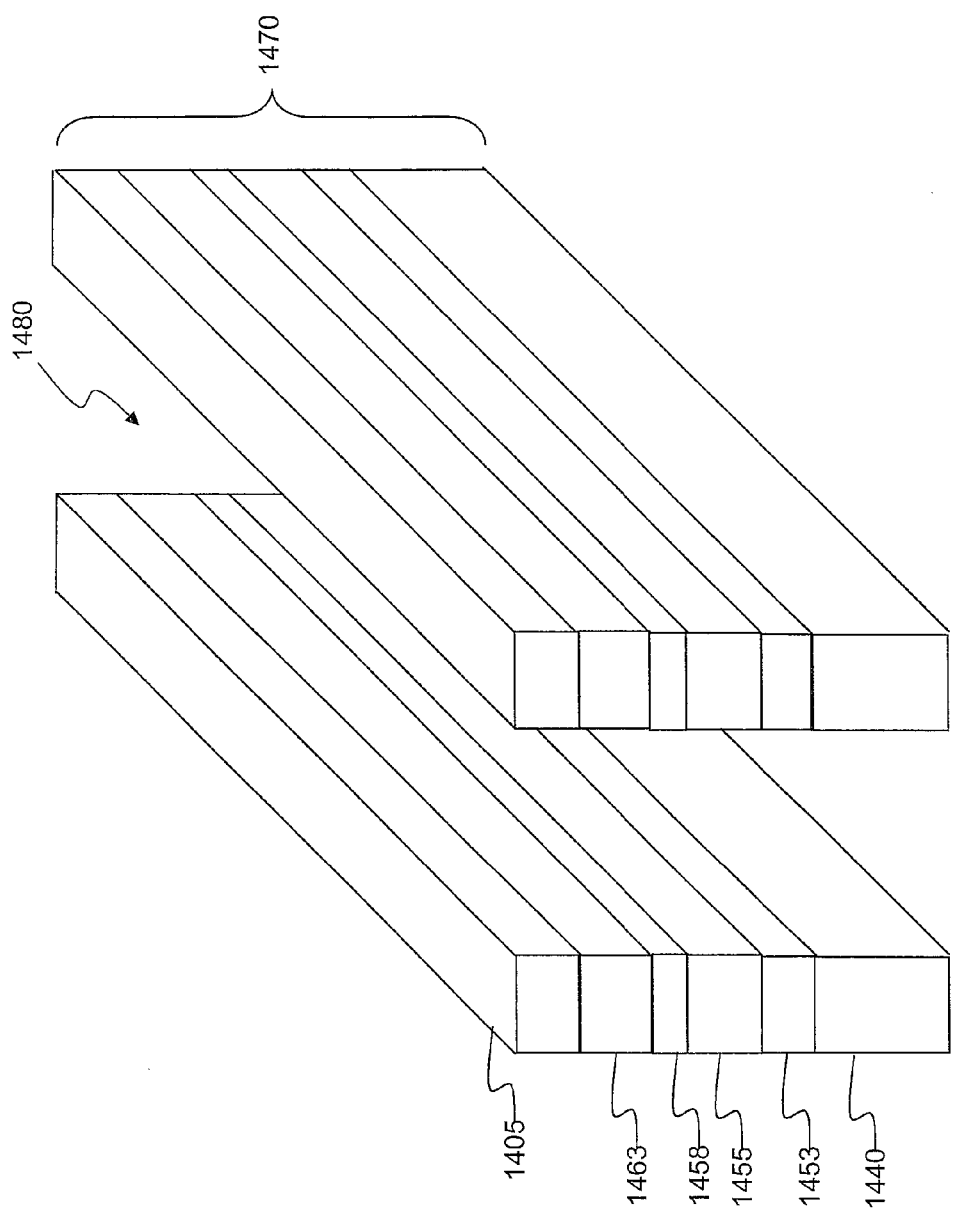
Figure 15:
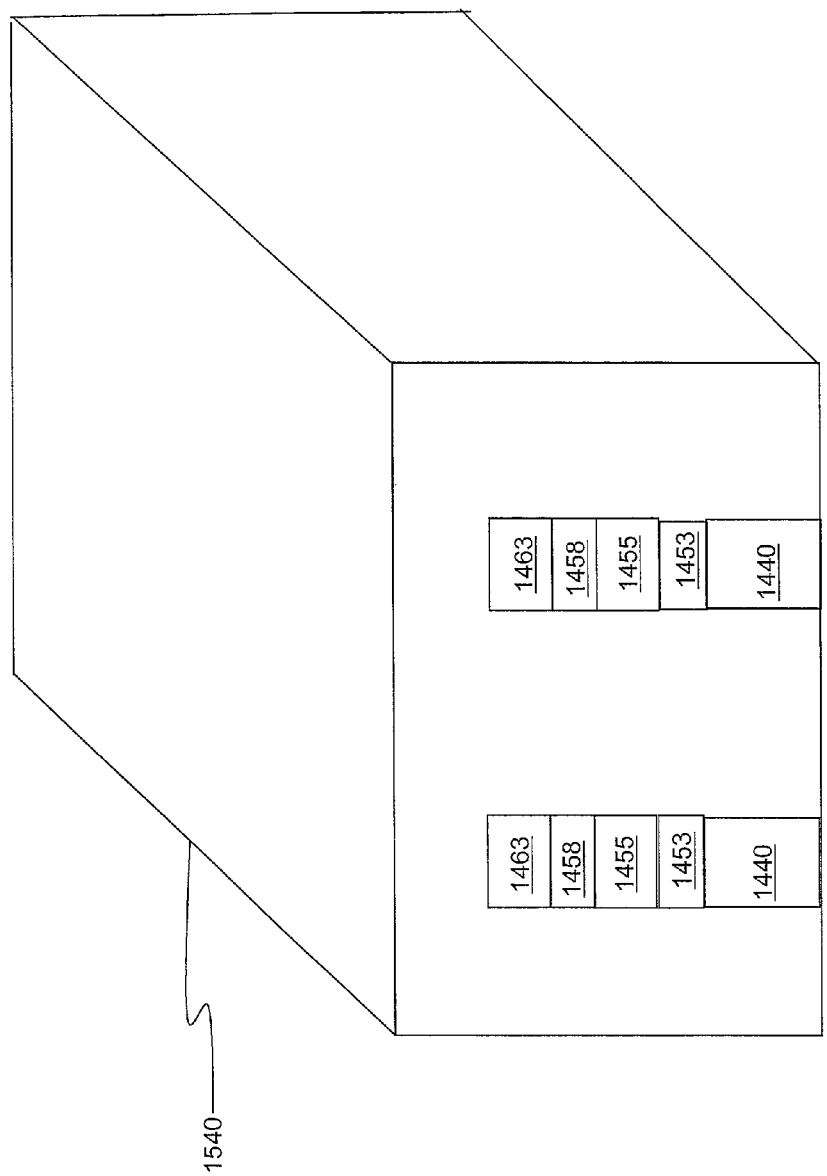
Figure 16:
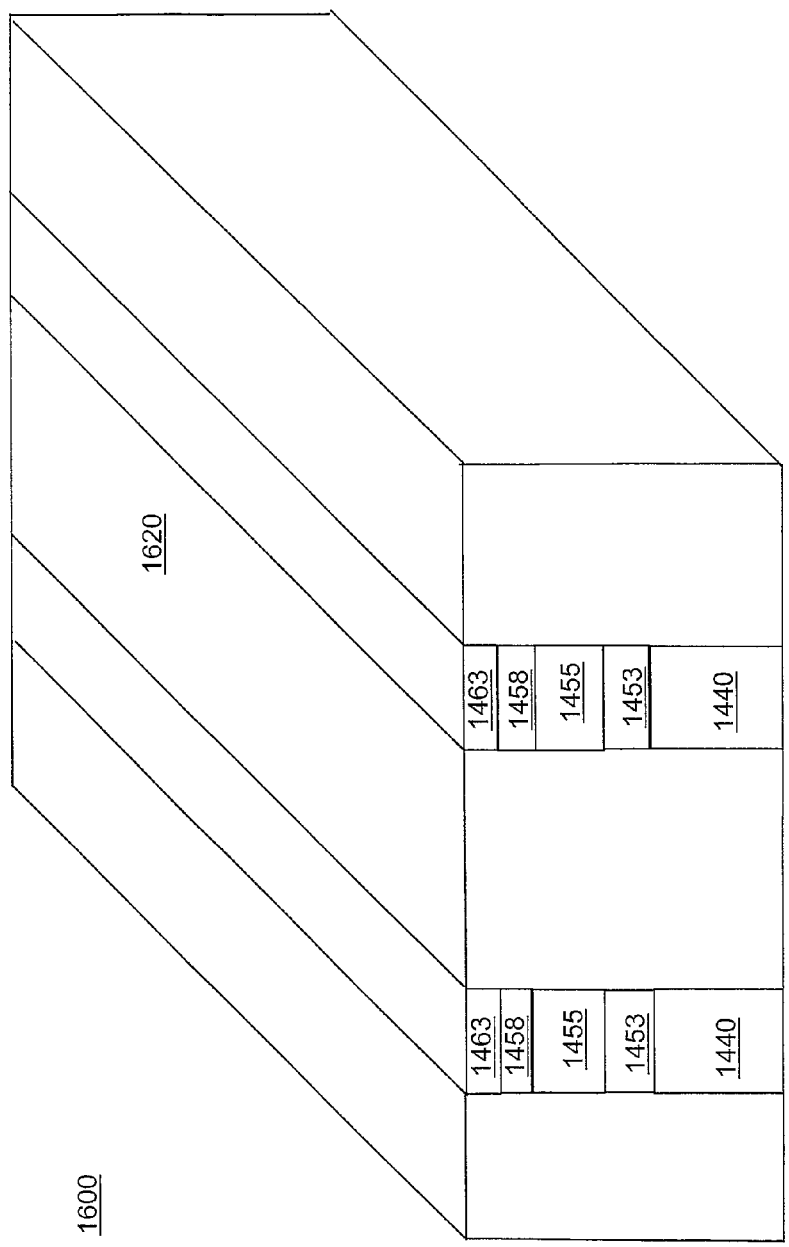
Figure 17:
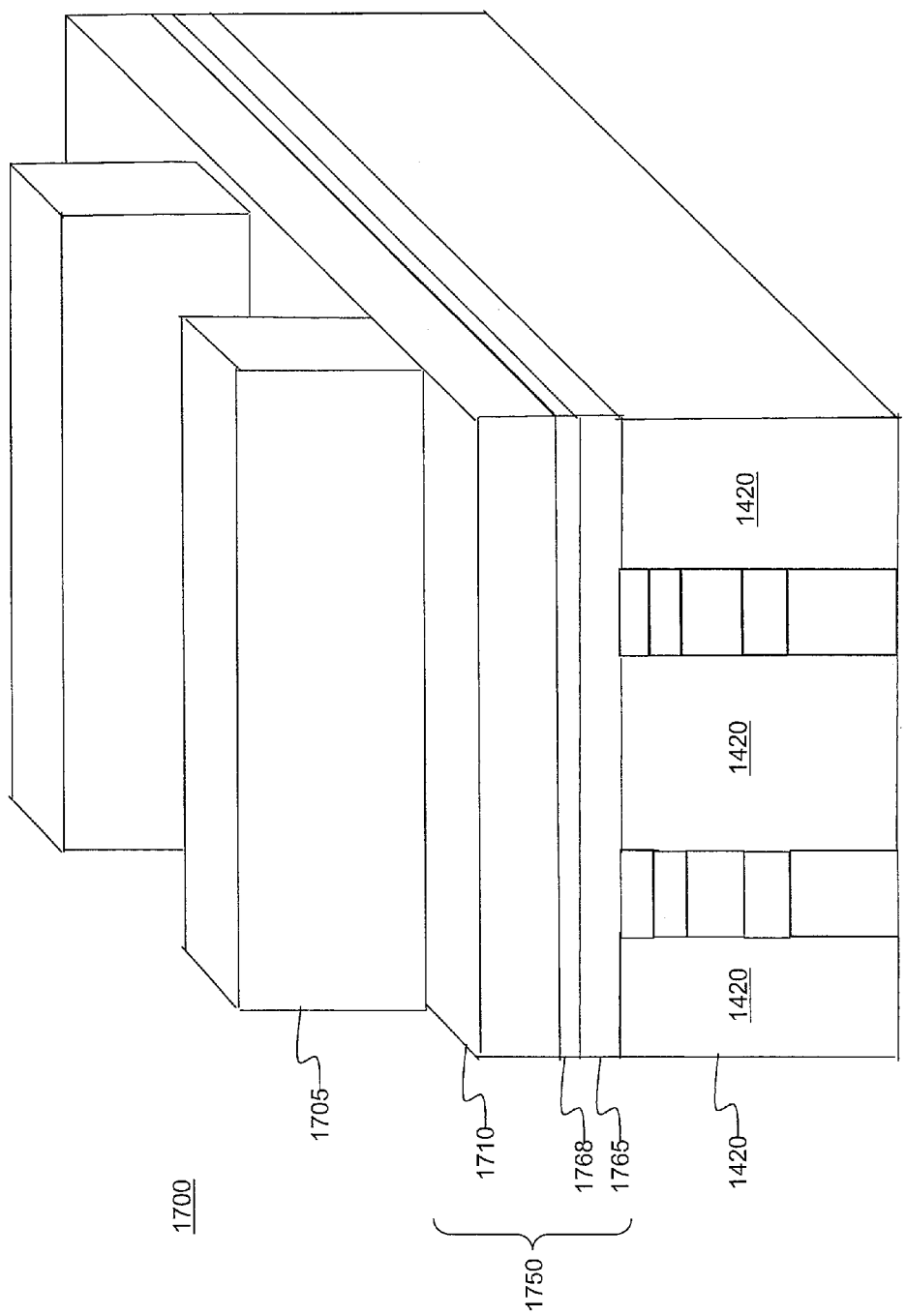
Figure 18:
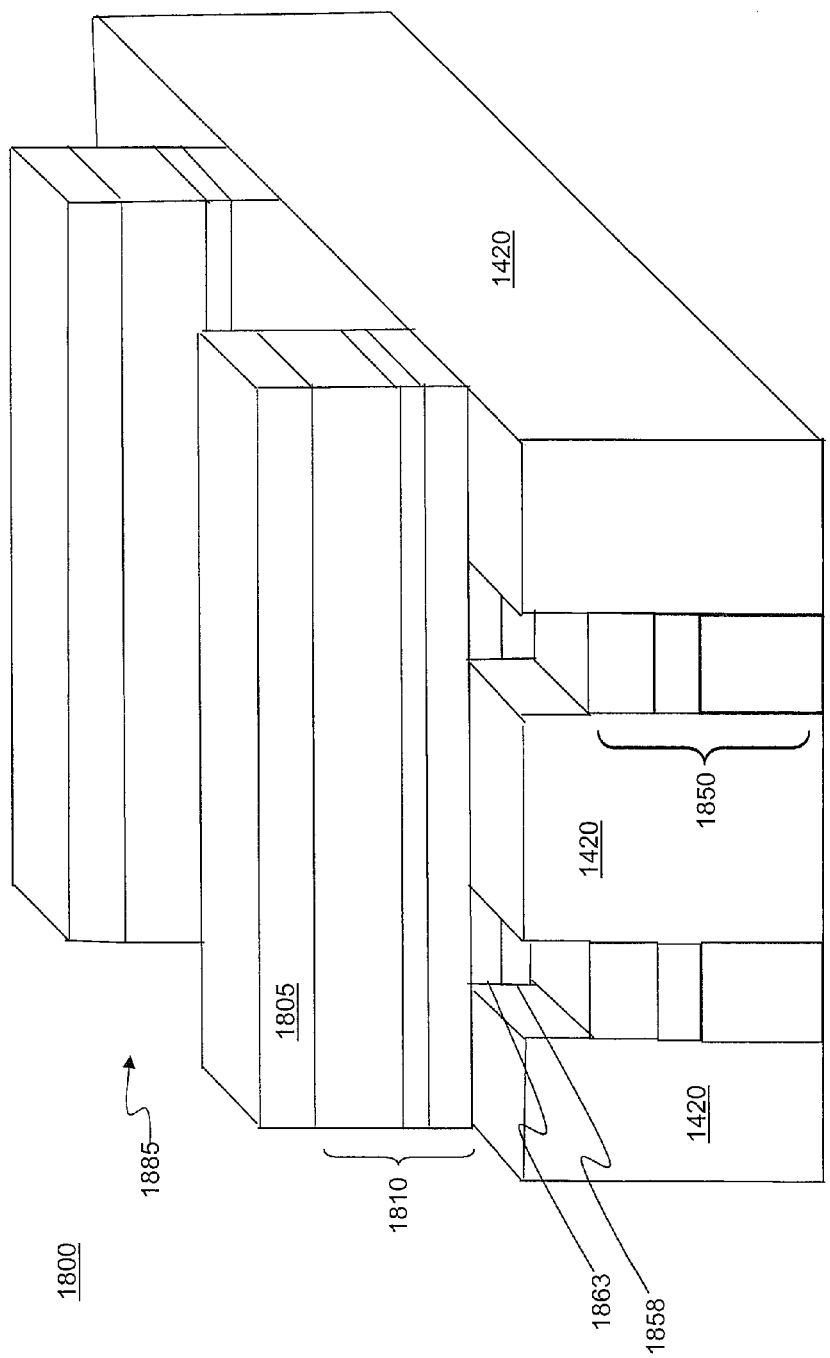

FIG. 12 is a flow diagram of a fabrication process 1200, according to an embodiment. FIGS. 13-19 are schematic perspective views showing structures resulting from various portions of process 1200, according to an embodiment. For example, process 1200 may be used to fabricate a PCMS cell, though claimed subject matter is not so limited. At block 1205, a planer composite film comprising row metal 1340, memory bottom electrode 1353, memory PCM 1355, memory top electrode 1358, and a carbon stop layer 1363 may be deposited (FIG. 13). As described above, carbon stop layer 1363 may be relatively resistant to a subsequent chemical-mechanical polish process. At block 1210, an etch mask may be deposited and patterned into set of etch mask lines 1305, resulting in a masked film stack 1300 shown in FIG. 12, for example. Such an etch mask may comprise a photoresist, a dielectric, or other material that is relatively easy to etch into a line pattern, for example. Patterning may be performed using photolithography (e.g., direct print, expose/shift/expose, expose/positive develop/negative develop), photolithography with pitch doubling process (e.g., spacers), and imprinting, just to name a few examples.

Continuing with process 1200, at block 1220, an isolation etch of film stack 1300 may be performed using a plasma etch process. Such an isolation etch may result in a self-aligned memory device active region and row metal structure, such as that shown in FIG. 14, for example. Adjacent lines 1470, which may be separated by isolation trench 1480, may comprise patterned row metal 1440, patterned memory bottom electrode 1453, patterned memory PCM 1455, patterned memory top electrode 1458, and patterned carbon stop layer 1463. Subsequent to an isolation etch, sidewalls of isolation trench 1480 may be cleaned using a combination of plasma treatment, a wet chemical process, and/or thin film deposition, for example. At block 1230, and shown in FIG. 15, a subsequent passivation process may comprise filling isolation trench 1480 with an insulating dielectric material 1540 using a deposition process comprising PECVD, CVD, ALD, or spin-on, just to name a few examples. Excess insulating dielectric material 1540 may then be removed using a CMP process that terminates at carbon stop layer 1463, resulting in a structure 1600 having insulating material 1620, such as that shown in FIG. 16, for example. As discussed above, carbon stop layer 1463 may comprise a top layer of film stack 1300 so that film stack layer 1300 may act as a polish stop, thus providing an opportunity to adjust a resulting height of structure 1600.

In a particular embodiment, carbon stop layer 1463, after serving its purpose as a stop layer for a CMP process, may be removed by any one of several known etching processes. In such a case, carbon stop layer 1463 may be replaced with another material suitable for a bottom switch electrode. For example, such replacement may be performed using a process involving a plasma etch or a wet etch, replacement material deposition, and a subsequent chemical-mechanical polish.

Continuing with process 1200, at block 1240, a composite film 1750 comprising switch PCM 1765, switch top electrode 1768, and column metal 1710 may be deposited on structure 1600. Subsequently, at block 1250, an etch mask may be deposited on top of such a film stack. Patterning such an etch mask into a set of lines 1705 may result in structure 1700, shown in FIG. 17, for example. At block 1260, process 1200 may next include applying an etching process to structure 1700 using lines 1705 as an etch mask. Such an etching process may etch composite film 1750 between lines 1705 to form trenches 1885 between switch devices 1810 and partially etched mask lines 1805, shown in FIG. 18, for example. In one implementation, insulating material 1420 may act as an etch stop to such an etch process. Accordingly, such an etch process may terminate at a top of structure 1600 at insulating material 1420. In one implementation, at least a portion of a carbon layer 1863 and memory top electrode 1858 may be removed during such an etch process. However, such an etch process may continue to etch portions of structure 1600 between insulating material 1420 depending, at least in part, on a duration of the etching process. In particular, memory portion 1850 between insulating material 1420 may be etched below an upper surface of insulating material 1420. A depth of etch of memory portion 1850 may be adjusted in order to etch and/or expose various patterned layers of memory portion 1850. As mentioned above, such an adjustment may be performed by selecting a duration of the etching process, for example. Accordingly, by performing such an adjustment, structure 1800 may be formed into a particular PCMS cell, such as PCMS cell shown in FIG. 11, for example.

Figure 19:
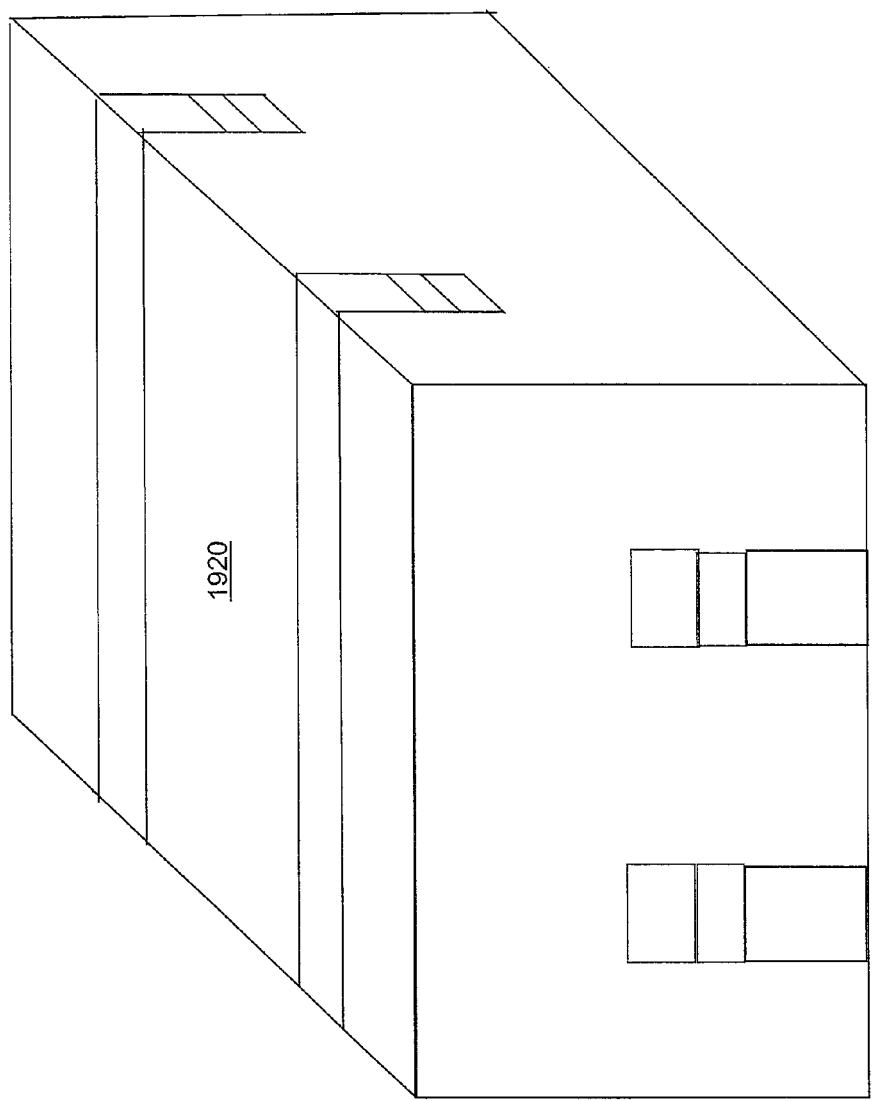

FIG. 19 shows a perspective view of structure 1900, according to an embodiment. Structure 1900 may result from a process including cleaning sidewalls of isolation trenches 1480 and adding a passivation material such as by a combination of plasma treatment, wet chemical, and/or thin film deposition, for example. Accordingly, at block 1270 of process 1200, isolation trench 1480 between device structures may be filled with insulating dielectric material 1920. In one implementation, a method of filler deposition may comprise plasma-enhanced chemical vapor deposition (PECVD), chemical vapor deposition (CVD), atomic layer deposition (ALD), and/or a spin-on process, for example. Excess insulation material may be removed using a chemical-mechanical polish, exposing a top of the underlying device structure. Structure 1900 may comprise a portion of a cross-point array, such as that shown in FIGS. 9-11, for example. Of course, such details of process 1200 are merely examples, and claimed subject matter is not so limited.

Figure 20:
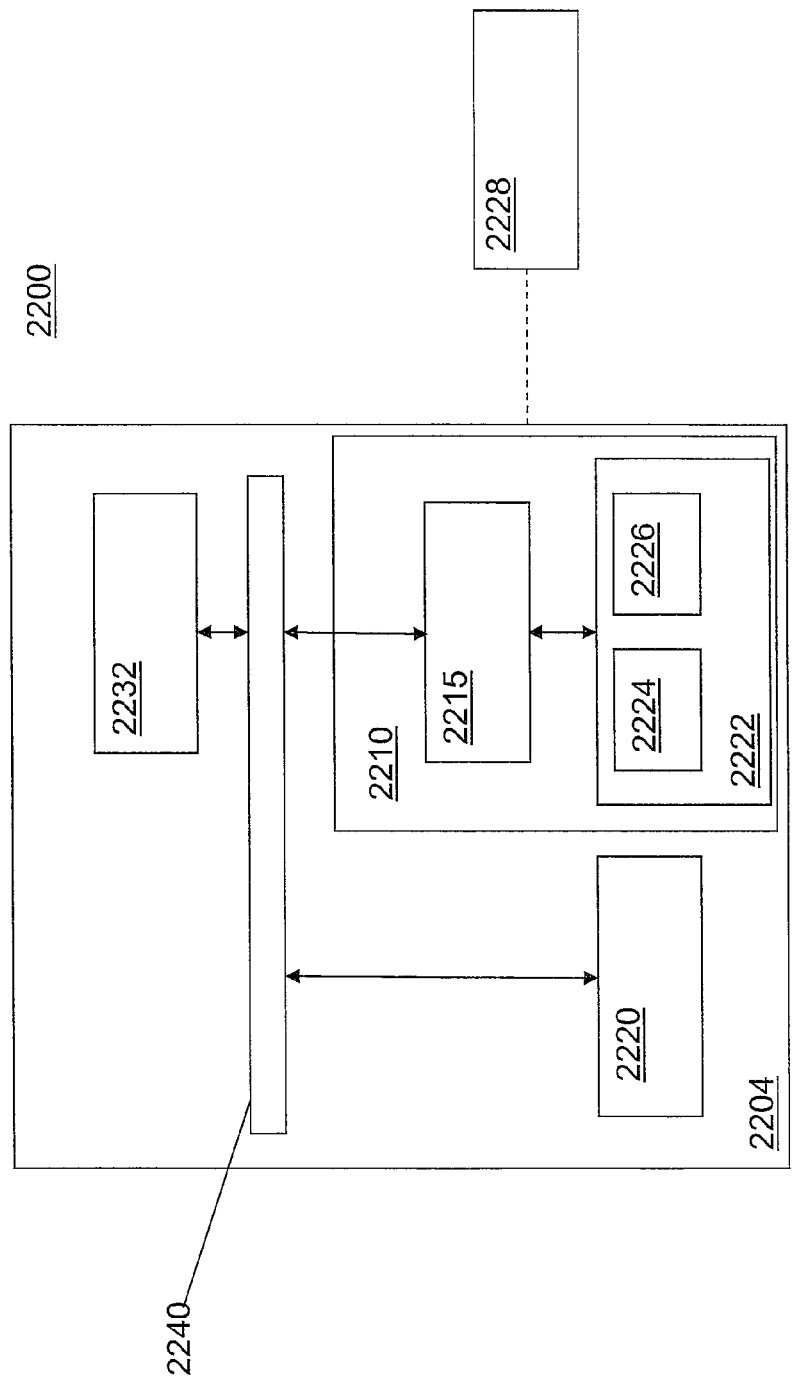
FIG. 20 is a schematic view of a computing system, according to an embodiment.

FIG. 20 is a schematic diagram illustrating an exemplary embodiment of a computing system 2000 including a memory device 2010. Such a computing device may comprise one or more processors, for example, to execute an application and/or other code. For example, memory device 2010 may comprise a memory that includes a cross-point array 900 of PCMS cells, shown in FIG. 9. A computing device 2004 may be representative of any device, appliance, or machine that may be configurable to manage memory device 2010. Memory device 2010 may include a memory controller 2015 and a memory 2022. By way of example but not limitation, computing device 2004 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 2000, and the processes and methods as further described herein, may be implemented using or otherwise including hardware, firmware, software, or any combination thereof. Thus, by way of example but not limitation, computing device 2004 may include at least one processing unit 2020 that is operatively coupled to memory 2022 through a bus 2040 and a host or memory controller 2015. Processing unit 2020 is representative of one or more circuits configurable to perform at least a portion of a data computing procedure or process. By way of example but not limitation, processing unit 2020 may include one or more processors, controllers, microprocessors, microcontrollers, application specific integrated circuits, digital signal processors, programmable logic devices, field programmable gate arrays, and the like, or any combination thereof. Processing unit 2020 may include an operating system configured to communicate with memory controller 2015. Such an operating system may, for example, generate commands to be sent to memory controller 2015 over bus 2040.

Memory 2022 is representative of any data storage mechanism. Memory 2022 may include, for example, a primary memory 2024 and/or a secondary memory 2026. Primary memory 2024 may include, for example, a random access memory, read only memory, etc. While illustrated in this example as being separate from processing unit 2020, it should be understood that all or part of primary memory 2024 may be provided within or otherwise co-located/coupled with processing unit 2020.

Secondary memory 2026 may include, for example, the same or similar type of memory as primary memory and/or one or more data storage devices or systems, such as, for example, a disk drive, an optical disc drive, a tape drive, a solid state memory drive, etc. In certain implementations, secondary memory 2026 may be operatively receptive of, or otherwise configurable to couple to, a computer-readable medium 2028. Computer-readable medium 2028 may include, for example, any medium that can carry and/or make accessible data, code, and/or instructions for one or more of the devices in system 2000.

Computing device 2004 may include, for example, an input/output 2032. Input/output 2032 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 2032 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method of forming a semiconductor device, the method comprising:
 forming a phase change memory (PCM) portion;
 forming a phase change switch portion;
 forming a carbon film disposed between said PCM portion and said phase change switch portion;
 depositing insulation to at least partially cover said carbon film; and
 terminating patterned removal of said insulation at said carbon film.

2. The method of claim 1, wherein said carbon film comprises graphitic carbon.

3. The method of claim 2, wherein said depositing said carbon film further comprises depositing said graphitic carbon using physical vapor deposition (PVD).

4. The method of claim 2, further comprising:
 forming said PCM portion over a row interconnect metal; and forming a contact electrode on said PCM portion and below said carbon film.

5. The method of claim 1, wherein said semiconductor device comprises a cross-point structure.

6. The method of claim 1, wherein a thickness of said carbon film is substantially between 200 and 300 angstroms.

7. The method of claim 1, wherein said carbon film comprises amorphous carbon.

8. The method of claim 1, further comprising:
   depositing insulation to cover said carbon film; and
   removing at least a portion of said insulation using a chemical mechanical polish (CMP) process that auto-terminates at said carbon film.

9. The method of claim 8, wherein said insulation comprises a dielectric material.

10. The method of claim 1, wherein said terminating patterned removal of said insulation is performed using a chemical-mechanical polish (CMP) process.

11. The method of claim 10, wherein said CMP process comprises a CMP process that auto-terminates at said carbon film.

12. The method of claim 1, wherein a thickness of said carbon film is substantially between 200 and 300 angstroms.

13. A memory device comprising:
    a memory cell array comprising a plurality of memory cells, wherein at least one of said memory cells comprises:
      a phase chase memory (PCM) portion;
      a phase change switch portion electrically contacting said PCM portion; and
      a carbon film disposed between said PCM portion and said phase change switch portion; and
      insulation disposed adjacent to said carbon film at a level based, at least in part, on a level of a top surface of said carbon film.

14. The memory device of claim 13, wherein said PCM portion comprises:
    a first phase change material between a first memory electrode and a second memory electrode.

15. The memory device of claim 13, wherein said memory cells are interconnected in a cross-point structure by electrically conducting column lines and row lines.

16. A system comprising:
    a memory device comprising a memory controller and a memory cell array, wherein said memory cell array comprises
      a plurality of memory cells, wherein at least one of said memory cells comprises a phase chase memory (PCM) portion and a phase change switch portion electrically contacting said PCM portion,
      a carbon film disposed between said PCM portion and said phase change switch portion, and
      insulation disposed adjacent to said carbon film at a level based, at least in part, on a level of a top surface of said carbon film; and
    a processor to host one or more applications and to initiate commands to said memory controller to provide access to said memory cells in said memory cell array through said memory controller.

17. The system of claim 16, wherein said memory cells are interconnected in a cross-point structure by electrically conducting column lines and row lines.

18. The system of claim 16, wherein said PCM portion is electrically contacting said row lines and said phase change switch portion is electrically contacting said column lines.

19. The system of claim 18, wherein said PCM portion comprises:
    a first phase change material between a first memory electrode and a second memory electrode.

* * * * *

UNITED STATES PATENT AND TRADEMARK OFFICE
CERTIFICATE OF CORRECTION

| | | |
|---|---|---|
| PATENT NO. | : 8,093,576 B1 | Page 1 of 1 |
| APPLICATION NO. | : 12/627128 | |
| DATED | : January 10, 2012 | |
| INVENTOR(S) | : Jong Won Lee | |

It is certified that error appears in the above-identified patent and that said Letters Patent is hereby corrected as shown below:

In column 9, line 28, in Claim 13, delete "chase" and insert -- change --, therefor.

In column 9, line 30, in Claim 13, after "portion;" delete "and".

In column 10, lines 10-11, in Claim 16, delete "comprises" and insert -- comprises: --, therefor.

In column 10, line 13, in Claim 16, delete "chase" and insert -- change --, therefor.

Signed and Sealed this
Thirteenth Day of March, 2012

David J. Kappos
*Director of the United States Patent and Trademark Office*